(12) United States Patent
Guo et al.

(10) Patent No.: US 11,251,367 B2
(45) Date of Patent: Feb. 15, 2022

(54) COMPOSITE MULTI-STACK SEED LAYER TO IMPROVE PMA FOR PERPENDICULAR MAGNETIC PINNING

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

(*) Notice: Subject to any disclaimer, the term of this patent is extended or adjusted under 35 U.S.C. 154(b) by 86 days.

(21) Appl. No.: 16/806,193

(22) Filed: Mar. 2, 2020

(65) Prior Publication Data

US 2021/0273157 A1  Sep. 2, 2021

(51) Int. Cl.
| | | |
|---|---|---|
| *H01L 43/02* | (2006.01) | |
| *H01L 43/10* | (2006.01) | |
| *H01L 27/22* | (2006.01) | |
| *H01L 43/12* | (2006.01) | |
| *H01L 43/08* | (2006.01) | |

(52) U.S. Cl.
CPC ............ *H01L 43/10* (2013.01); *H01L 27/222* (2013.01); *H01L 43/02* (2013.01); *H01L 43/08* (2013.01); *H01L 43/12* (2013.01)

(58) Field of Classification Search
CPC ....... H01L 43/10; H01L 27/222; H01L 43/02; H01L 43/08; H01L 43/12
USPC .......................................................... 257/421
See application file for complete search history.

(56) References Cited

U.S. PATENT DOCUMENTS

| 11,088,200 B1* | 8/2021 | Xiao | ................... H01F 10/3272 |
| 2021/0249469 A1* | 8/2021 | Xiao | ....................... H01L 43/02 |

\* cited by examiner

*Primary Examiner* — Jami Valentine Miller

(57) ABSTRACT

The invention comprises a novel composite multi-stack seed layer (CMSL) having lattice constant matched crystalline structure with the Co layer in above perpendicular magnetic pinning layer (pMPL) so that an excellent epitaxial growth of magnetic super lattice pinning layer $[Co/(Pt, Pd\ or\ Ni)]_n$ along its FCC (111) orientation can be achieved, resulting in a significant enhancement of perpendicular magnetic anisotropy (PMA) for perpendicular spin-transfer-torque magnetic-random-access memory (pSTT-MRAM) using perpendicular magnetoresistive elements as basic memory cells which potentially replace the conventional semiconductor memory used in electronic chips, especially mobile chips for power saving and non-volatility.

20 Claims, 3 Drawing Sheets

COMPOSITE MULTI-STACK SEED LAYER TO IMPROVE PMA FOR PERPENDICULAR MAGNETIC PINNING

BACKGROUND OF THE INVENTION

1. Field of the Invention

This invention relates to a novel composite multi-stack seed layer (CMSL) to improve perpendicular magnetic anisotropy (PMA) for magnetic pinning multilayer in a magnetic structure, such as a perpendicular magnetic tunnel junction.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a storage layer (SL) having a changeable magnetization direction, an insulating spacing layer, and a fixed pinning layer (PL) that is located on the opposite side from the SL and maintains a predetermined magnetization direction. The insulating spacing layer sandwiched between the SL and the PL serves as a tunneling barrier (TB) in a magnetic tunnel junction. In a SOT MRAM, there is an additional SOT layer immediately located on a surface of the SL, which is opposite to a surface of the SL where the insulating spacing layer is provided. SOT can be a thin layer made of heavy transition metal layer such as W or Ta, Pt, etc., or a layer of topological insulating layer such as BiSB.

As a write method to be used in such magnetoresistive elements of a STT MRAM, there has been suggested a write method (spin torque transfer switching technique) using spin momentum transfers. According to this method, the magnetization direction of a storage layer (SL) is reversed by applying a spin-polarized current to the magnetoresistive element. Furthermore, as the volume of the magnetic layer forming the SL is smaller, the injected spin-polarized current to write or switch can be also smaller. Accordingly, this method is expected to be a write method that can achieve both device miniaturization and lower currents. In a SOT MRAM, an electric current flows in the SOT layer, which is also a paramagnetic layer, to generate a spin-polarized current and inject it into its adjacent recording layer, which is a ferromagnetic layer. The spin-polarized current then exerts a torque on the magnetic moment to reverse it.

Further, as in a so-called perpendicular pMTJ element, both two magnetization films, i.e., the storage layer (SL) and the pinning layer (PL), have easy axis of magnetization in a direction perpendicular to the film plane due to their strong perpendicular interfacial anisotropy and magnetic crystalline anisotropy (shape anisotropies are not used), and accordingly, the device shape can be made smaller than that of an in-plane magnetization type. Also, variance in the easy axis of magnetization can be made smaller. Accordingly, by using a material having a large perpendicular magnetic crystalline anisotropy, both miniaturization and lower currents can be expected to be achieved while a thermal disturbance resistance is maintained.

There has been a known technique for achieving a high MR ratio in a perpendicular MTJ element by forming an underneath MgO tunnel barrier layer and a BCC or HCP-phase cap layer that sandwich a thin storage layer (SL) having an amorphous CoFeB ferromagnetic film and accelerate crystallization of the amorphous ferromagnetic film to match interfacial grain structure to MgO layer through a thermal annealing process. The SL crystallization starts from the tunnel barrier layer side to the cap layer and forms a CoFe grain structure having a perpendicular magnetic anisotropy, as Boron elements migrate into the cap layer. Accordingly, a coherent perpendicular magnetic tunnel junction structure is formed. By using this technique, a high MR ratio can be achieved.

A core structure of the pMTJ stack 100 comprises (see FIG. 1) a fixed perpendicular magnetic pinning element (pMPE) 70, a tunnel barrier, and a variable storage layer (SL) 90. The pMPE is typically formed by a relatively thick perpendicular synthetic antiferromagnetic (pSAF) stack of composition: seed-layer/$[Co/X]_m$/Co/Ru/Co/$[X/Co]_n$/crystal-structure-breaking-layer (15)/FeCoB reference layer (16)/tunnel barrier (17), where X represents Pt, Pd or Ni metals, m and n are integers (normally m>n), and Ru is a spacer to provide perpendicular RKKY coupling between $[Co/X]_m$/Co and Co/$[X/Co]_n$. Here and thereafter throughout this application, each element written in the left side of "/" is stacked below an element written in the right side thereof. A typical film stack of bottom-pinned pMTJ (100) is shown in FIG. 1 which starts from a seed layer (11) such as Pt, a perpendicular synthetic antiferromagnetic (pSAF) multilayer stack containing a perpendicular magnetic pinning layer (pMPL) (12) $[Co/Pt]_m$/Co, a Ru spacer (13), an upper magnetic multilayer (14) such as Co/$[Pt/Co]_n$, a crystal structure transition layer (15) such as W, Mo or Ta, a magnetic reference layer (16) such as amorphous CoFeB, a TB MgO (17), a tri-layer SL formed with a first storage layer (18) such as CoFeB, a non-magnetic B absorption layer (19) such as W, Mo or Ta and a second storage layer (20) such as CoFeB, a capping layer (21), such as MgO, W or W/Ru. This pMTJ comprises a thick pMPE film stack although it has a strong pSAF.

Recently a French research group proposed (see *Scientific Reports* 8, Article number: 11724, 2018) another pMTJ stack 200 with a thin synthetic antiferromagnetic (tSAF) structure (see FIG. 2) comprising a Pt seed-layer (11) on which a perpendicular pinning layer $[Co/Pt]_m$/Co (12), bi-layer Ru/W spacer (15) and magnetic reference layer CoFeB (16) with the rest (layer 18 through 21 similar to those in FIG. 1). Although the authors claimed multi-functionalities of their bi-layer Ru/W spacer (15): (i) absorbing boron out of the magnetic layer (FeCoB) in contact with W layer upon annealing, (ii) allowing the crystalline transition between the FCC part of the stack $[Co/Pt]_m$/Co of 3-fold symmetry and the BCC part of the stack FeCoB next to the MgO barrier (of 4-fold symmetry) and (iii) preventing inter-diffusion between the two parts of the SAF during high temperature annealing. RKKY coupling at W/CoFeB interface is not as strong as at the Co/Ru interface, such tSAF exhibits a serious magnetic instability during information writing.

No matter whether it is a thick pSAF or thin tSAF film stack, a key factor to achieve stable magnetic pinning is perpendicular magnetic anisotropy (PMA) of the perpendicular magnetic pinning layer (pMPL) $[Co/Pt]_m$/Co (12), which provides a magnetic anchoring force to prevent the entire pSAF (or tSAF) film stack from a concurrent rotation under the influence of spin transfer torque or an external magnetic field. It was reported (see Article: *Appl. Phys. Lett.* 96, 152505 (2010)) that the PMA of Co/Pt (or Co/Pd) magnetic multilayer is closely dependent on the lattice constant of the multilayer itself, and a positive (perpendicular) PMA occurs only when Co/Pt (or Co/Pd) multilayer has FCC crystalline structure with a lattice constant larger than ~0.372 nm, and the larger the lattice constant, the higher is the PMA of Co/Pt (or Co/Pd) multilayer. Without an external factor, increase of the PMA of Co/Pt (or Co/Pd) can only be achieved by increasing the thickness of Pt (or Pd) spacer. However, a research group found (see their report: *Sensors*, 17(12): 2743, December 2017) that the effective energy per bilayer starts to decrease linearly after a lattice constant value of ~0.383 nm. They attributed this to the enhanced increase in the Pd fraction compared to the Co, which weakens the ferromagnetic coupling between the adjacent ultrathin Co layers.

SUMMARY OF THE PRESENT INVENTION

The present invention discloses a composite multi-stack seed layer (CMSL) having face-center-cubic (FCC) crystalline structure to promote a perfect FCC (111) growth for above perpendicular magnetic pinning layer (pMPL) to enhance its PMA needed for magnetic stabilization. Said CMSL comprises at least a four-layer structure containing a base layer, a modulating-layer (ML) having a face-center-cubic (FCC) crystalline structure, a buffer-layer (BL) and a (Pt, Pd or Ir) layer stacked in a form of base layer/ML/BL/(Pt, Pd or Ir), base layer/[ML/BL/(Pt, Pd or Ir)]$_z$ or base layer/{[ML/BL]$_x$/(Pt, Pd or Ir)}$_y$, with repetition numbers z, x, y between 2-5 inclusive, wherein the base layer is made of a metal layer, metal oxide layer or metal nitride layer comprising at least one element selected from the group consisting of Ta, Hf, Nb, Mo, W, Zr, Ti, V, Cr, Ru, Rh, Zn, the ML is made of a metal or metal nitride layer selected from Cu, CuN, CuCo, CuNi or NiN, the BL is made of a metal layer comprising at least one element selected from the group consisting of Ta, Hf, Nb, Zr, Mo, W. The BL can be a single element metal layer, an alloyed metal layer or a metal layer comprising multiple sub-layers of different elements.

Said CMSL and pMPL both having an FCC crystalline structure together with a composite non-magnetic spacer (CnmS) and a perpendicular magnetic reference layer (pMRL) having a body-center-cubic (BCC) crystalline structure constitute a strong perpendicular magnetic pinning element (pMPE): CMSL/pMPL/CnmS/pMRL with enhanced synthetic antiferromagnetic (eSAF) coupling.

Said pMPL comprises a multilayer stack containing [Co/(Pt, Pd or Ni)]$_n$/Co, and said CnmS comprises either a single layer of Ru, or Ir or a bi-layer of (Ru, Rh or Ir)/Cr or tri-layer of (Ru, Rh or Ir)/(W, Mo or V)/Cr, and said pMRL comprises a multilayer stack either of Co/[(Pt, Pd or Ni)]$_m$/Co/(W, Mo or Ta)/CoFeB for single layer Ru spacer, or Fe/CoFeB, Fe/FeB, FeB/CoFe for bilayer or tri-layer CnmS.

Said pMPE with large PMA are employed to form a perpendicular magnetoresistive element (pMRE) comprising CMSL/pMPL/CnmS/pMRL/TB/SL/CL, wherein said TB is a tunnel barrier, SL is a storage layer (SL) having magnetic anisotropy in a direction perpendicular to a film surface and having a variable magnetization direction on the tunnel barrier layer and CL is a capping layer.

Said pMRE is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

DETAILED DESCRIPTION OF THE INVENTION

Figure 1:
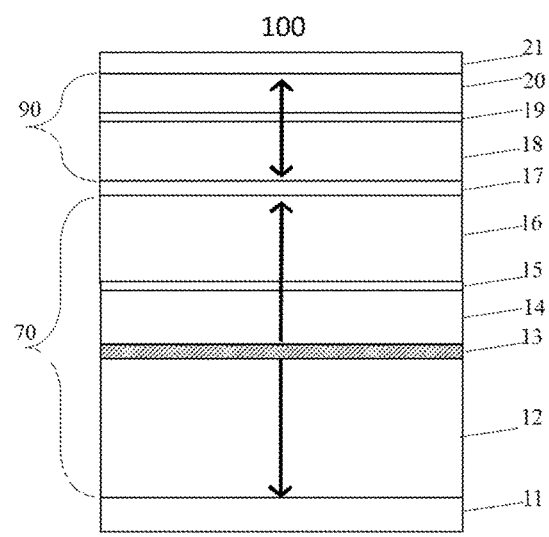
FIG. 1 A conventional pSTT-MRAM film stack with a perpendicular synthetic antiferromagnetic (pSAF) pinning layer.
Figure 2:
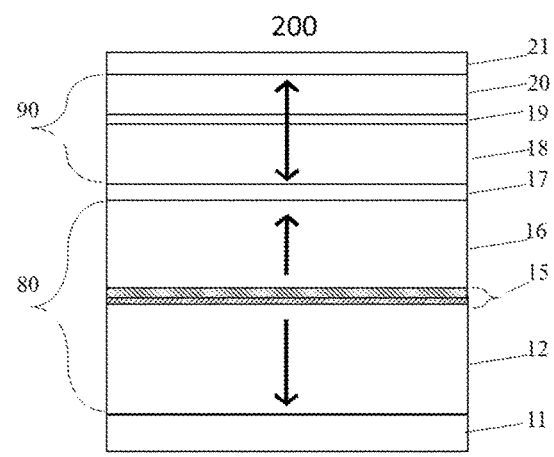
FIG. 2 A pSTT-MRAM film stack with a thin synthetic antiferromagnetic (tSAF) pinning layer.
Figure 3A:
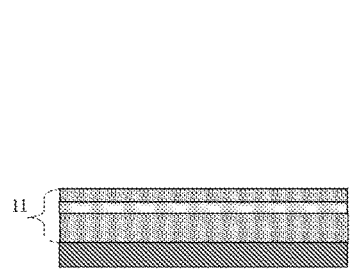
FIG. 3A Building stack of a composite multi-stack seed layer (CMSL).

The perpendicular magnetic anisotropy (PMA) of the perpendicular magnetic pinning layer (pMPL) [Co/Pt, Pd or Ni)]$_n$ multilayer) is closely related to its lattice structure. In this invention, we employ a composite multi-stack seed layer (CMSL) having a FCC crystalline structure with (111) orientation plane normal to a film surface, i.e., FCC (111) texture, at the bottom of pMPL multilayer to provide a specially engineered lattice mold (bedding) for the growth of closed packed Co layer in the [Co/Pt, Pd or Ni)]$_n$ multilayer to maximize its PMA. Among the various materials in periodical table, there are some metallic elements (see Table 1) which naturally form an FCC crystalline structure in their solid phase with lattice constant close to the closed packed (either FCC or HCP) Co, which is the key element that form [Co/Pt, Pd or Ni)]$_n$ multilayer, which sometimes is referred as a superlattice due to its periodic structure in atomic level. The Co layer in said pMPL is directly deposited on the last layer (Pt, Pd or Ir) of CMSL, which has a perfect FCC (111) orientation normal to the film surface. Said CMSL comprises at least a modulating-layer (ML) having a face-center-cubic (FCC) lattice constant between 0.34 nm and 0.37 nm, a buffer-layer (BL) and a (Pt, Pd or Ir) layer with several film configurations as below:

(1) a four-layer stack structure (FIG. 3A) base-layer/ML/BL/(Pt, Pd or Ir), wherein the base-layer is made of a metal layer, metal oxide layer or metal nitride layer comprising at least one element selected from the group consisting of Ta, Hf, Nb, Mo, W, Zr, Ti, V, Cr, Ru, Rh, Zn and having a thickness between 1-5 nm, the ML is made of a metal or metal nitride layer selected from Cu, CuN, CuCo, CuNi or NiN, having a thickness between 3-30 nm, the BL is made of a metal layer selected from the group consisting of Ta, Hf, Nb, Zr, Mo, W and having a thickness range 0.3-1.5 nm, and the layer (Pt, Pd or Ir) has a thickness between 1-2 nm.

Figure 3B:
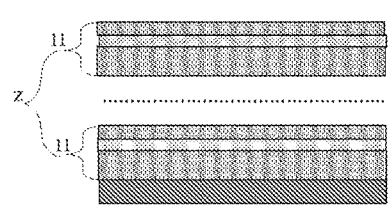
FIG. 3B Repeated multi-stack of CMSL with one repetition number z.

(2) a repeated multi-layer stack structure (FIG. 3B) base-layer/[modulating-layer/buffer-layer/(Pt, Pd or Ir)]$_z$, wherein said z is an integer between 2 and 5 inclusive, and the base-layer is made of a metal layer, metal oxide layer or metal nitride layer comprising at least one element selected from the group consisting of Ta, Hf, Nb, Mo, W, Zr, Ti, V, Cr, Ru, Rh, Zn and having a thickness between 1-5 nm, each modulating-layer is made of a metal or metal nitride layer selected from Cu, CuN, CuCo, CuNi or NiN, having a thickness between 3-30 nm, each buffer-layer is made of a metal layer selected from the group consisting of Ta, Hf, Nb, Zr, Mo, W and having a thickness between 0.3-1.5 nm, and each layer of (Pt, Pd or Ir) has a thickness between 1-2 nm.

Figure 3C:
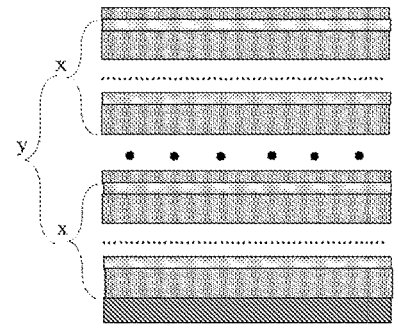
FIG. 3C Repeated multi-stack of CMSL with two repetition numbers x and y.

(3) a repeated multi-layer stack structure (FIG. 3C) base-layer/{[modulating-layer/buffer-layer]$_x$/(Pt, Pd or Ir)}$_y$, wherein said x, y are integers between 2 and 5 inclusive, and the base-layer is made of a metal layer, metal oxide layer or metal nitride layer comprising at least one element selected from the group consisting of Ta, Hf, Nb, Mo, W, Zr, Ti, V, Cr, Ru, Rh, Zn and having a thickness between 1-5 nm, each modulating-layer is made of a metal or metal nitride layer selected from Cu, CuN, CuCo, CuNi or NiN, having a thickness between 3-30 nm, each buffer-layer is made of a metal layer selected from the group consisting of Ta, Hf, Nb, Zr, Mo, W and having a thickness between 0.3-1.5 nm, and each layer of (Pt, Pd or Ir) has a thickness between 1-2 nm.

(4) said CuN or NiN in above CMSL may be replaced by metal nitrides TiN, RhN, AlN or AgN. By adjusting nitrogen content, the formed materials can also provide a good lattice match with the Co layer in said [Co/Pt or Pd] multilayer.

The following lists are some typical embodiments to illustrate the use of said CMSL to improve PMA for perpendicular magnetic stabilization for bottom-pined and dual-pinned pSTT-MRAM having either a thick pSAF or thin tSAF film stack:

First Embodiment

Figure 4:
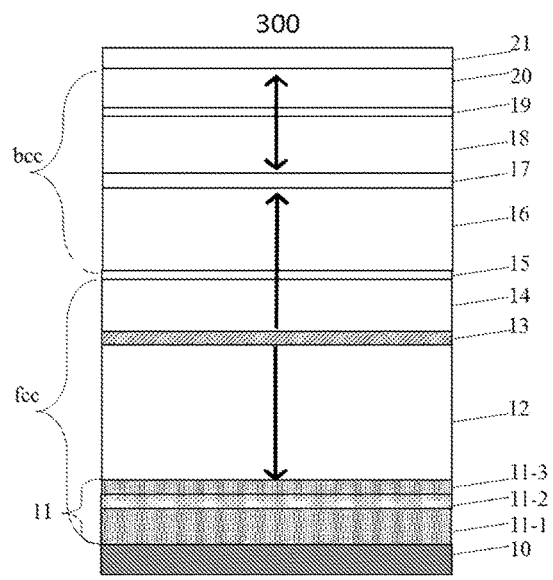
FIG. 4 A bottom-pinned pSTT-MRAM with a thick pSAF film stack having a CMSL.

FIG. 4 is bottom-pinned pSTT-MRAM (300) with a thick pASF film stack. A composite multi-stack seed layer (CMSL) (11) was first grown on a device substrate (10), followed by a thick pSAF stack (12/13/14) of [Co/Pt or Pd]$_n$Co/(Ru or Ir)/Co/[(Pt or Pd)/Co]$_m$ with thickness values of (0.3-0.7) for Co and 0.2-0.8 for Pt (or Pd) and repetition number (n>m) between 2-6 for n and 1 to 4 for m, followed by a crystalline structure transition layer (15) of Ta, W, or Mo with thickness between 0.1-0.5 nm, and magnetic reference layer (16) of CoFeB with thickness between 0.9-1.3 nm, a tunnel barrier (17) of MgO between 0.8-1.2 nm, a composite storage layer of first magnetic CoFeB (18) with thickness between 1.0-1.5 nm, B absorption layer of Ta, W, Mo) (19) with thickness between 0.15-0.5 nm, second magnetic CoFeB (20) with thickness between 0.5-1.0 nm and a capping stack of MgO/W/Ru (21) with thickness of (1.0-1.5 nm)/1-3 nm)/(2-5 nm) respectively. The annealing temperature of above film stack is between 350 C-450 C for 30 min to 150 min. With the help of said CMSL, after annealing the bottom portion of the stack between 11-14 will be converted into FCC crystalline structure with (111) orientation normal to substrate surface and upper portion of the stack (16-20) into a BCC (100) crystalline structure to achieve a large PMA while maintaining high tunnel magnetoresistive (TMR) value. During annealing the layer (15) of Ta, W or Mo helped the crystalline transition between bottom FCC to top BCC structure.

Second Embodiment

Figure 5:
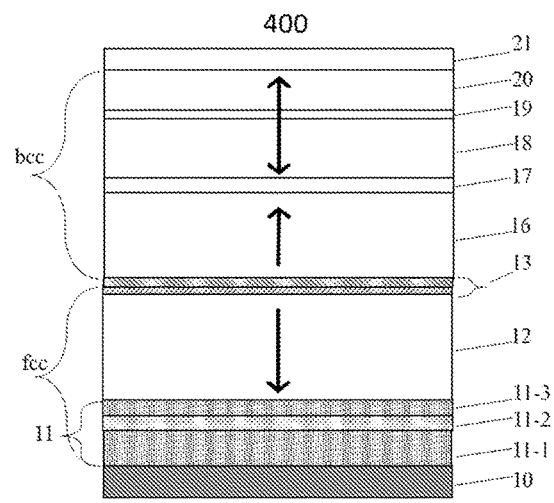
FIG. 5 A bottom-pinned pSTT-MRAM with a thin tSAF film stack having a CMSL.

FIG. 5 is a bottom-pinned pSTT-MRAM with a thin film stack (400) with an enhanced synthetic antiferromagnetic (eSAF) coupling. A composite multi-stack seed layer (CMSL) (11) was first grown on a device substrate (10), followed by a magnetic superlattice [Co/X]$_n$/Co/ on is an integer between 2-6) with thickness of Co(0.25-0.6 nm)/X (0.2-0.4 nm) (12) on top of the seed layer where X is selected among Pt, Pd or Ni, a composite eSAF [(Ru or Ir)/Cr/Fe or (Ru, Rh or Ir)/(W or Mo)/Cr/Fe] (13), an amorphous FeB or CoFeB (16) reference layer in contact with Fe from below, a tunnel barrier MgO (17), a tri-layer recording layer formed with a first magnetic layer (18), a non-magnetic bridging layer (19) and a second magnetic layer (20), a capping layer, such as MgO, W or W/Ru (21). In the above stack, the thickness of Ru, Ru or Ir is between 0.3 to 0.7 nm and Cr or (W or Mo)/Cr thickness is between 0.1 to 0.5 nm, with a combined [(Ru, Rh or Ir)/Cr or (Ru, Rh or Ir)/(W or Mo)/Cr] thickness chosen to reach the first or the second peak for an effective RKKY coupling, the amorphous FeB or CoFeB reference layer (16) has a B composition between 15-35% with a thickness between 0.8 to 1.4 nm, the thickness of MgO TB is between 0.8-1.2 nm, the thickness of the first magnetic memory layer (20) can be selected among CoFeB, FeB, Fe/CoFeB with a B composition between 15-30% and preferably at 20% and a thickness between 1-1.6 nm, the non-magnetic bridging layer is selected among W, Mo, Ta with a thickness between 0.1-0.6 nm, the second magnetic memory layer (20) is selected from CoFeB, FeB with a B composition between 15-30% with a thickness between 0.4-0.8 nm, the capping layer is can be either (1-1.5 nm) MgO/(2-5 nm)W, (2-5 nm)W/(2-4 nm)Ru or MgO/W/Ru. The use of Fe at the Cr interface, not only increases the RKKY coupling hence improving magnetic stability for the device, but also creates a good BCC structure right starting from the CoFeB reference layer, throughout the barrier MgO layer to the entire memory tri-layer layer owing to the intrinsic BCC structure of Fe. Such a bottom-pinned pSTT-MRAM film stack will have strong magnetic pinning with sharp layer interfaces and higher and stable TMR characteristics, which is good for pSTT-MRAM device application.

Figure 6:
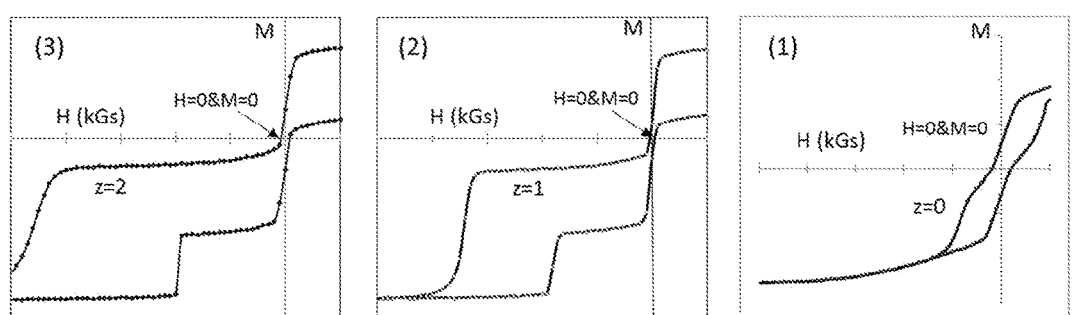
FIG. 6 Experimental test results of magnetization for three pSTT-MRAM film stacks having different CMSL configurations with CMSL repetition n=0, 1 and 2.

The annealing temperature of above bottom-pinned film pSTT-MRAM stacks are between 350 C-450 C for between 30 min to 150 min. With the help of said CMSL (11), after annealing the low portion (11-13) of the stack will be converted into FCC crystalline structure with (111) orientation normal to film surface and upper portion of the stack (16-20) above Cr into a BCC (100) crystalline structure to achieve a large PMA while having a high tunnel magnetoresistive (TMR) value. For comparison, FIG. 6 shows three VSM test results for three pMTJ samples with an exact film structure for all layers 12-21 except CMSL is z=0 (plot-1) with no CMSL), z=1 (plot-2) with CMSL containing Ta(2 nm)/Cu(10 nm)/Ta(0.5 nm)/Pt(1.5 nm), and z=2 (plot-3) with CMSL containing Ta(2 nm)/[Cu(10 nm)/Ta(0.5 nm)/Pt(1.5 nm)]2. It can be clearly seen that without said CMSL (n=0), the perpendicular exchange coupling field pHex) is zero (plot-1). With increasing z to 1 (plot-2) and 2 (plot-3), the pHex progressively increases indicating a stronger perpendicular magnetic pinning capability in against external magnetic field or thermal disturbance.

Third Embodiment

Figure 7:
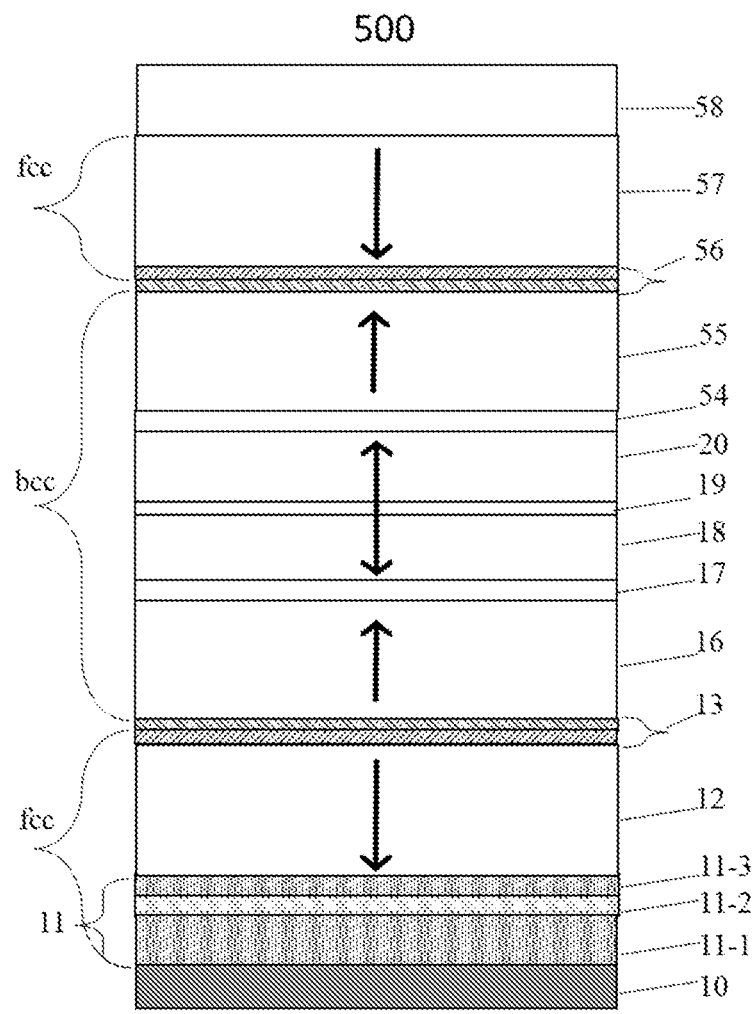
FIG. 7 A dual-pinned pSTT-MRAM with a thin tSAF film stack having a CMSL.

FIG. 7 is a dual-pinned pSTT-MRAM (500) with two thin eSAF and a CMSL at bottom. A typical structure of stack 500 including substrate (10)/CMSL(11)/[Co/(Pt, Pd or Ni)]$_n$/Co(12)/(Ru/Cr) or (Ru/W/Cr)(13)/Fe/CoFeB(16)/ MgO(17)/CoFeB(18)/(W or Mo)(19)/CoFeB(20)/MgO(54)/ CoFeB/(55)/Fe/(Cr/Ru) or (Cr/W/Ru) (56)/Co/[(Pt, Pd or Ni)/Co]$_n$(57)/cap layer (58). During high temperature annealing, said CMSL (11) will help the two multilayers [Co/(Pt, Pd or Ni)]$_n$ and [(Pt, Pd or Ni)/Co]$_n$ in contact with from the bottom (12,13) layers and top (56,57) layers to transform into FCC crystalline structure with (111) orientation aligned normal to the film surface and all the middle (16,17,18,19,20,54,55) layers to transform into BCC crystalline structure with (100) orientation, which not only allows to further increase the perpendicular anisotropy (PMA) to the middle composite storage layer (CSL) and thus increase the thermal stability and prolong the retention time of MRAM device, but also allows to increase the thickness of the CSL (from 1.8 nm for bottom-pinned pSTT-MRAM stack to 4 nm) which further increases TMR value.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

TABLE 1

| Atomic No | Element | X-Structure | Lattice const [A] |
|---|---|---|---|
| 28 | Ni | FCC | 3.52 |
| 29 | Cu | FCC | 3.61 |
| 45 | Rh | FCC | 3.8 |
| 46 | Pd | FCC | 3.89 |
| 77 | Ir | FCC | 3.84 |
| 78 | Pt | FCC | 3.92 |
| 26 | Fe | BCC | 2.87 |
| 42 | Mo | BCC | 3.15 |
| 73 | Ta | BCC | 3.31 |
| 74 | W | BCC | 3.16 |
| 22 | Ti | HCP | 2.95/4.68 |
| 27 | Co | HCP | 2.51/4.07 |
|  |  | FCC | 3.55 |
| 44 | Ru | HCP | 2.70/4.28 |

The invention claimed is:

1. A perpendicular magnetic pinning element (pMPE) comprising
   a composite multi-stack seed layer (CMSL) provided on the surface of a substrate and having at least a modulating-layer (ML), a (Pt, Pd or Ir) layer and a buffer-layer (BL) sandwiched by the ML and the (Pt, Pd or Ir) layer;
   a perpendicular magnetic pinning layer (pMPL) provided on the surface of the CMSL and having a face-center-cubic (FCC) crystalline structure and having a perpendicular magnetic anisotropy (PMA) and having an invariable magnetization direction;
   an antiferromagnetic coupling spacer (AFCS) provided on the surface of the pMPL;
   a perpendicular magnetic reference layer (pMRL) provided on the surface of the AFCS and having a perpendicular magnetic anisotropy and having an invariable magnetization direction;
   wherein,
   said ML comprising a metal layer or a metal nitride layer and having a face-center-cubic (FCC) crystalline lattice constant between 0.34 nm and 0.37 nm, preferred to be selected from Cu, CuN, CuCo, CuNi or NiN;
   said BL comprising a metal layer having at least one element selected from the group consisting of Ta, Hf, Nb, Zr, Mo, W and having a thickness between 0.3-1.5 nm;
   said CMSL forming a face-center-cubic (FCC) crystalline structure with a (111) texture;
   said pMPE forming a strong perpendicular antiferromagnetic coupling (pAFC) between the pMPL and the pMRL through the AFCS.

2. The element of claim 1, wherein said pMPL comprises a multilayer stack structure [Co/(Pt, Pd or Ni)]$_n$/Co, wherein n is an integer between 2 and 6 inclusive, and thicknesses of each said Co sub-layer and (Pt, Pd or Ni) sub-layer are between 0.25 nm-0.7 nm and between 0.2 nm-0.8 nm, respectively.

3. The element of claim 1, wherein said CMSL comprises a four-layer stack structure base-layer/ML/BL/(Pt, Pd or Ir), wherein the base-layer is made of a metal layer, metal oxide layer or metal nitride layer comprising at least one element selected from the group consisting of Ta, Hf, Nb, Mo, W, Zr, Ti, V, Cr, Ru, Rh, Zn and having a thickness between 1-20 nm, the thickness of said ML is between 3-30 nm, the thickness of said BL is between 0.3-1.5 nm, and the thickness of said (Pt, Pd or Ir) layer is between 1-3 nm.

4. The element of claim 1, wherein said CMSL comprises a repeated multi-layer stack structure base-layer/[ML/BL/ (Pt, Pd or Ir)]$_z$ or base-layer/[ML/BL]$_z$/(Pt, Pd or Ir), wherein said z is an integer between 2 and 5 inclusive, and the base-layer is made of a metal layer, metal oxide layer or metal nitride layer comprising at least one element selected from the group consisting of Ta, Hf, Nb, Mo, W, Zr, Ti, V, Cr, Ru, Rh, Zn and having a thickness between 1-20 nm, the thickness of each said ML is between 1.5-30 nm, the thickness of each said BL is between 0.3-1.5 nm, and thickness of each said (Pt, Pd or Ir) layer is between 1-3 nm.

5. The element of claim 1, wherein said CMSL comprises a repeated multi-layer stack structure base-layer/ {[ML/BL]$_x$/(Pt, Pd or Ir)}$_y$, wherein said x, y are integers between 2 and 5 inclusive, and the base-layer is made of a metal layer, metal oxide layer or metal nitride layer comprising at least one element selected from the group consisting of Ta, Hf, Nb, Mo, W, Zr, Ti, V, Cr, Ru, Rh, Zn and having a thickness between 1-20 nm, the thickness of each said ML is between 1.5-30 nm, the thickness of each said BL is between 0.3-1.5 nm, and thickness of each said (Pt, Pd or Ir) layer is between 1-3 nm.

6. The element of claim 1, wherein said CMSL and said pMPL both have their closed-packed FCC (111) crystalline orientation normal to the film surface.

7. The element of claim 1, wherein said pMRL comprises a multilayer stack structure [Co/(Pt, Pd or Ni)]$_m$/(Co or Ta/Co)/(W or Mo)/CoFeB or Fe/[Co/(Pt, Pd or Ni)]$_m$/(Co or Ta/Co)/(W or Mo)/CoFeB, wherein m is an integer between 2 and 4 inclusive; and said Co layer has a thickness between 0.25-0.7 nm, said (Pt, Pd or Ni) layer has a thickness between 0.2-0.8 nm, said CoFeB layer has a thickness between 0.7-1.5 nm, said (W or Mo) layer has a thickness between 0.1-0.5 nm, said Ta layer has a thickness between 0.05-0.2 nm.

8. The element of claim 1, wherein said pMRL comprises a bi-layer stack structure Fe/CoFeB, Fe/FeB, FeB/CoFeB, or Fe/CoFe, wherein said Fe layer has a thickness between 0.1-0.5 nm, said CoFeB, FeB and CoFe layer have thicknesses between 0.7 nm-1.3 nm.

9. The element of claim 1, wherein said pMRL is made of a single layer of CoFeB and having a thickness between 0.7 nm-1.3 nm.

10. The element of claim 1, wherein said AFCS is made of a single layer of (Ru, Rh or Ir) or a bi-layer structure of (Ru, Rh or Ir)/(Cr, Mo, W or V) or tri-layer structure of (Ru, Rh or Ir)/(W, Mo or V)/Cr.

11. The element of claim 1, further comprising a perpendicular magnetic tunnel junction (pMTJ), said pMTJ comprising: said pMPE, a tunnel barrier (TB) provided on the surface of said pMRL and a storage layer (SL) provided on the surface of said TB, wherein said SL has a perpendicular magnetic anisotropy and a variable magnetization direction.

12. The element of claim 11, wherein said TB is an MgO layer having a thickness between 0.8 nm to 1.5 nm, and said SL is a single layer CoFeB or a tri-layer CoFeB/(W or Mo)/CoFeB having a total CoFeB thickness between 1 nm-2.0 nm, wherein said (W or MO) layer has a thickness between 0.1 nm-0.5 nm.

13. The element of claim 11, wherein said pMTJ comprises a bottom-pinned pSTT-MRAM film element having a stack of CMSL/pMPL/AFCS/pMRL/TB/SL.

14. The element of claim 11, wherein said pMTJ comprises a dual-pinned pSTT-MRAM film element having a stack of CMSL/pMPL/AFCS/pMRL/TB/SL/TB/pMRL/AFCS/pMPL.

15. The element of claim 13, wherein said bottom-pinned pSTT-MRAM film element comprises a film stack of CMSL/[Co/(Pt, Pd or Ni)]$_n$/Co/(Ru, Rh or Ir)/[Co/(Pt, Pd or Ni)]$_m$/Co/(Ta, W or Mo)/CoFeB/MgO/CoFeB/(W or Mo)/CoFeB/MgO/W/Ru/Ta, where the repetition numbers n and m are from 2 to 6 and from 1 to 4, respectively.

16. The element of claim 13, wherein said bottom-pinned pSTT-MRAM film element comprises a film stack of CMSL/[Co/(Pt, Pd or Ni)]$_n$/Co/(Ru, Rh or Ir)/Cr/Fe/CoFeB/MgO/CoFeB/(W or Mo)/CoFeB/MgO/W/Ru/Ta or CMSL/[Co/(Pt, Pd or Ni)]$_n$/Co/(Ru, Rh or Ir)/(W, Mo or V)/Cr/Fe/CoFeB/MgO/CoFeB/(W or Mo)/CoFeB/MgO/W/Ru/Ta, where the repetition number n is from 2 to 6.

17. The element of claim 14, wherein said dual-pinned pSTT-MRAM film element comprises a film stack of CMSL/[Co/(Pt, Pd or Ni)]$_n$/Co/(Ru, Rh or Ir)/Cr/Fe/CoFeB/MgO/CoFeB/(W or Mo)/CoFeB/MgO/CoFeB/Fe/Cr/(Ru, Rh or Ir)/Co/[(Pt, Pd or Ni)/Co]$_n$/W/Ru or CMSL/[Co/(Pt, Pd or Ni)]$_n$/Co/(Ru, Rh or Ir)/(W, Mo or V)/Cr/Fe/CoFeB/MgO/CoFeB/W or Mo/CoFeB/MgO/CoFeB/Fe/Cr/(W, Mo or V)(Ru, Rh or Ir)/Co/[(Pt, Pd or Ni)/Co]$_n$/W/Ru, where the repetition number n is from 2 to 6.

18. The element of claim 14, wherein said dual-pinned pSTT-MRAM film element comprises a film stack of CMSL//[Co/(Pt, Pd or Ni)]$_n$/Co/(Ru or Ir)/Co/[(Pt, Pd or Ni]/Co]$_m$/(W, Mo or Ta)/CoFeB/MgO/CoFeB/(W or Mo)/CoFeB/MgO/CoFeB/(W, Mo or Ta)/Co/[Co/(Pt, Pd or Ni)]$_m$/Co/(Ru or Ir)/Co/[(Pt, Pd or Ni)/Co]$_n$/W/Ru, where the repetition numbers n and m are from 2 to 6 and from 1 to 4, respectively.

19. A method of forming a bottom-pinned pSTT-MRAM film stack comprising
  forming a composite multi-stack seed layer (CMSL) having at least one sandwich structure modulating-layer/buffer-layer/(Pt, Pd or Ir), wherein, said modulating-layer comprising a metal layer or a metal nitride layer and preferred to be selected from Cu, CuN, CuCo, CuNi or NiN, said buffer-layer comprising a metal layer having at least one element selected from the group consisting of Ta, Hf, Nb, Zr, Mo, W
  forming a perpendicular magnetic pinning layer (pMPL) on the surface of said CMSL and having a face-center-cubic (FCC) crystalline structure and having an invariable perpendicular magnetization direction;
  forming an antiferromagnetic coupling spacer (AFC) provided on the surface of the pMPL and having a single layer structure of (Ru, Rh or Ir), bi-layer structure of (Ru, Rh or Ir)/Cr or tri-layer structure of (Ru, Rh or Ir)/(W, Mo or V)/Cr;
  forming a perpendicular magnetic reference layer (pMRL) provided on the surface of the AFC and having a body-center-cubic (BCC) crystalline structure and having an invariable magnetization direction;
  forming a tunnel barrier (TB) layer on the surface of said pMRL;
  forming a magnetic storage layer (SL) on the surface of said TB;
  forming a capping layer on the surface of said SL;
  annealing said film stack substrate/CMSL/pMPL/AFMs/PMRL/TB/SL/capping layer at temperature between 350-450 C for 30-150 minutes.

20. The method of claim 19 makes a pSTT-MRAM device having said bottom-pinned pSTT-MRAM film stack electrically connected between a top electrode and a bottom electrode and having write/read operations as a storage device.

* * * * *